United States Patent [19]
Wollesen

[11] Patent Number: 5,804,470
[45] Date of Patent: Sep. 8, 1998

[54] METHOD OF MAKING A SELECTIVE EPITAXIAL GROWTH CIRCUIT LOAD ELEMENT

[75] Inventor: Donald L. Wollesen, Saratoga, Calif.

[73] Assignee: Advanced Micro Devices, Inc., Sunnyvale, Calif.

[21] Appl. No.: 735,463

[22] Filed: Oct. 23, 1996

[51] Int. Cl.⁶ .............................. H01L 21/20; H01L 21/44
[52] U.S. Cl. ........................... 438/141; 438/380; 438/675
[58] Field of Search ..................................... 438/675, 141, 438/380

[56] References Cited

U.S. PATENT DOCUMENTS

| | | | |
|---|---|---|---|
| 4,675,715 | 6/1987 | Lepselter et al. | 357/59 |
| 4,727,045 | 2/1988 | Cheung et al. | 437/47 |
| 4,890,144 | 12/1989 | Teng et al. | 357/23.4 |
| 5,159,430 | 10/1992 | Manning et al. | 357/51 |
| 5,236,856 | 8/1993 | Chan et al. | 437/47 |
| 5,267,192 | 11/1993 | Nogami | 365/154 |
| 5,388,067 | 2/1995 | Sato et al. | 365/154 |
| 5,441,907 | 8/1995 | Sung et al. | 437/48 |
| 5,567,644 | 10/1996 | Rolfson et al. | 437/60 |
| 5,599,736 | 2/1997 | Tseng | 437/186 |

FOREIGN PATENT DOCUMENTS

| | | | |
|---|---|---|---|
| 0 281 711 A | 9/1988 | European Pat. Off. | G11C 11/40 |
| WO 97/22148 | 6/1997 | WIPO | H01L 27/11 |

*Primary Examiner*—Brian Dutton
*Attorney, Agent, or Firm*—H. Donald Nelson

[57] ABSTRACT

A method of manufacturing a polysilicon plug in an integrated circuit semiconductor device wherein the polysilicon plug is selectively doped to act as a resistive load or alternatively to act as a diode load. The polysilicon load can be used in an SRAM memory cell.

9 Claims, 5 Drawing Sheets

METHOD OF MAKING A SELECTIVE EPITAXIAL GROWTH CIRCUIT LOAD ELEMENT

BACKGROUND OF THE INVENTION

1. Field of the Invention

This invention relates generally to the manufacture of high performance semiconductor devices and, more particularly, to the manufacture of transistors having a polysilicon plug that is selectively doped to be a resistive load or a diode load and, even more particularly, to the manufacture of SRAM transistors having a polysilicon plug that is selectively doped to be a resistive load or a diode load.

2. Discussion of the Related Art

Static random access memory (SRAM) is used in computers as memory that is used by the microprocessor or central processing unit to store instructions and data from programs that are currently being used by the computer. The SRAM memory often used in this way is known as cache and is located between the microprocessor and the memory known as main memory. Main memory is typically dynamic random access memory (DRAM). The SRAM is optimized to run at the speed of the microprocessor. The reason that SRAM is not normally used for main memory is that because SRAM is optimized to run at the speed of the microprocessor it is more costly than DRAM and takes more chip space. This is because, in order to make the RAM run at the speed of the microprocessor it is necessary to use more transistors, typically four to six per bit, to allow high-speed direct access to information in the memory by the microprocessor. This means that less memory is available per unit area on the chip and results in higher cost. In contrast, DRAM is designed for high-density indirect access by using only one transistor per bit, which provides more memory per unit area on the chip and lower cost albeit at lower operating speed. Because of the increasing requirements of modern memory-hungry applications which are reaching multiple-megabyte proportions, DRAM will remain the memory of choice for main memory. However, modern computer systems require more cache memory to allow the microprocessor to fetch information at full speed. As the speed of the microprocessors increases and as more use of multitasking increases, the requirement for more higher speed SRAM memory will continue to grow. In addition, to achieve the full speed direct access, it is also becoming necessary for the computer designer to design the cache memory to be manufactured on the main CPU chip.

For this reason, the size of the SRAM memory cell is very important. Numerous methods and devices have been conceived and tried in order to shrink the size of the individual SRAM memory cell. The comparison standard remains the classic CMOS (complementary metal on silicon) six transistor design consisting of a CMOS R-S flip-flop and two transmission gates to allow for the necessary read and write functions. The load devices in the R-S flip-flop in the standard six transistor SRAM memory cell are p-channel transistors. However, the p-channel transistors are not critical and can be replaced with passive loads such as "poly load," diode loads (reverse biased, leakage current only), and depletion NMOS loads. Plain low resistance material works, but draws too much current for practical large RAM (random access memory) arrays. Prior art poly loads and diode loads entail thin film deposition masking, doping, and some physical area in the cell.

What is needed is a method of manufacturing a polysilicon plug that can be doped to be an effective resistive load or that can be doped to be an effective diode load for an SRAM memory cell.

SUMMARY OF THE INVENTION

The present invention is directed to a method of manufacturing a polysilicon plug in an integrated circuit semiconductor device The polysilicon plug is formed over a selected region of the integrated circuit semiconductor device and is selectively doped to be either a resistive load or a diode load.

The present invention is also directed to a method of manufacturing a polysilicon plug in an integrated circuit semiconductor SRAM memory cell. The polysilicon plug is formed to connect the drain region of a MOSFET with a metal layer and is selectively doped to be either a resistive load or a diode load.

The present invention is better understood upon consideration of the detailed description below, in conjunction with the accompanying drawings. As will become readily apparent to those skilled in this art from the following description there is shown and described a preferred embodiment of this invention simply by way of illustration of the mode best suited to carry out the invention. As it will be realized, the invention is capable of other different embodiments, and its several details are capable of modifications in various, obvious aspects all without departing from the scope of the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION

Figure 1:
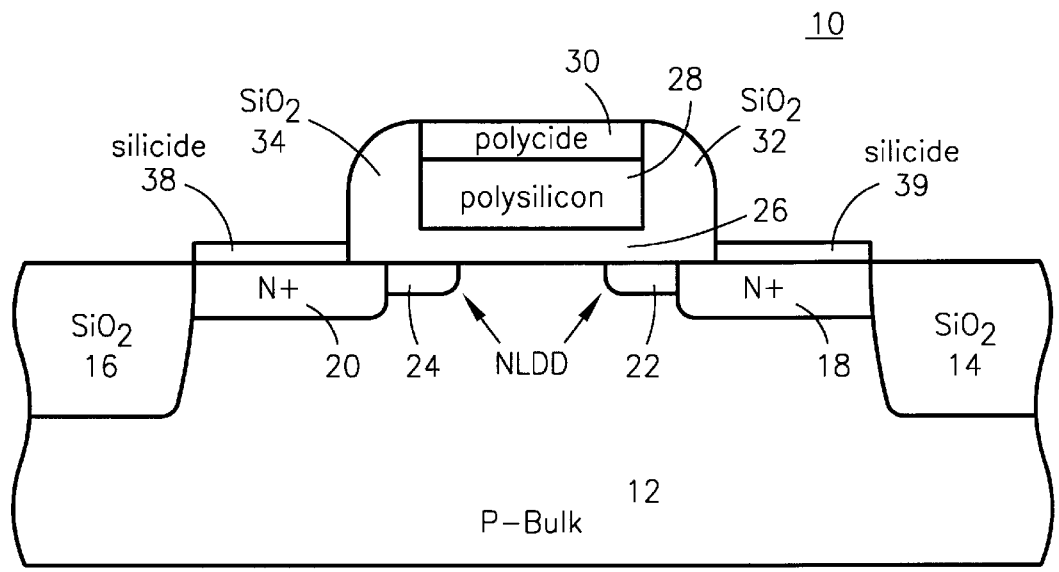
FIG. 1 shows a partially formed transistor at a manufacturing point at which the structure of the present invention is started.

Referring to FIG. 1 there is shown a partially formed transistor 10 formed on a P-bulk substrate 12 with silicon dioxide dielectric layers 14 and 16 formed in the substrate 12. Dielectric layers 14 and 16 serve to isolate the transistor 10 from other transistors or other adjacent elements (not shown) that may be formed in the substrate. Transistor 10 has a drain region 18 and a source region 20 formed in the substrate 12. Also formed adjacent to drain region 18 and source region 20 are n-type lightly doped drain (LDD) regions 22 and 24. As is known in the art, a lightly doped region adjacent to a source region is called an LDD (a lightly doped drain) region. These regions may be doped as needed and may form MDD (moderately doped drains) or HDD (heavily doped drains). A gate oxide region 26 is formed on the substrate 12 generally between the drain region 18 and the source region 20. A polysilicon gate 28 is formed on the gate oxide region 26. Also shown is a polycide region 30 formed on the polysilicon gate 28. Silicon dioxide sidewall spacers 32 and 34 are formed on both sides of the polysilicon gate 28 and are contiguous with the gate oxide region 26. Also shown is an optional silicide region 38 formed on the source region 20, and an optional silicide region 39 formed on the drain region 18. The manufacture of the transistor up to the structure shown in FIG. 1 is well within the state-of-the-art and is assumed to be within the knowledge of a person of ordinary skill in the semiconductor manufacturing art.

Figure 2:
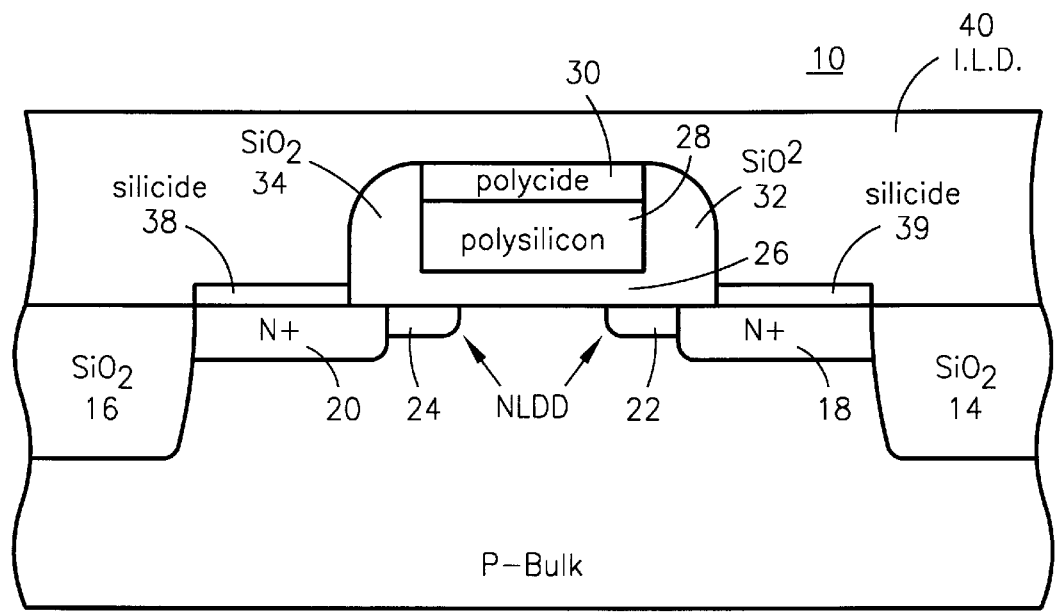
FIG. 2 shows an interlayer dielectric formed on the partially formed transistor shown in FIG. 1.

Referring to FIG. 2 there is shown the initial step of the present invention wherein an interlayer dielectric 40 is deposited on the partially formed transistor 10 shown in FIG. 1. It is noted that like numerals denote like structures in the figures. The interlayer dielectric can be any dielectric such as silicon dioxide.

Figure 3:
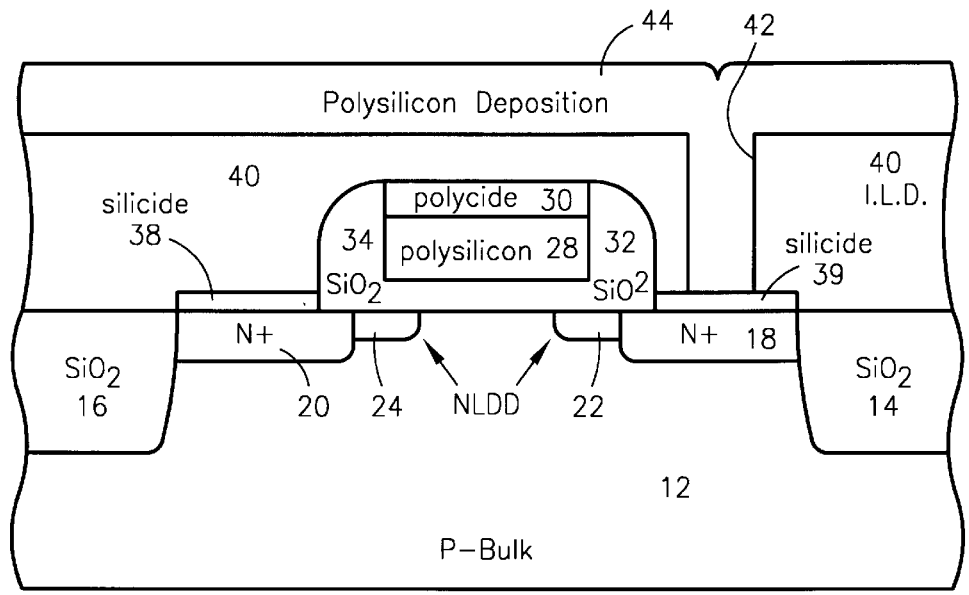
FIG. 3 shows an opening formed in the interlayer dielectric over the drain region of the partially formed transistor shown in FIG. 2 and a layer of polysilicon deposited on the transistor and into the opening formed in the interlayer dielectric.

Referring to FIG. 3 there is shown the partially formed transistor 10 with the interlayer dielectric 40 having been etched to form an opening 42 through the interlayer dielectric 40 to the drain region 18. After the opening 42 is formed a layer 44 of polysilicon is deposited over the interlayer dielectric 40 and which fills the opening 42. It is noted that the layer 44 can be deposited as amorphous silicon or as polysilicon. In the case in which a layer of amorphous silicon is deposited, a subsequent anneal would change the structure of the amorphous silicon to a polysilicon structure. In addition, the layer 44 may be initially doped or left undoped. The polysilicon may be doped with an ion implant or a gaseous pre-deposition or any other method appropriate for doping polysilicon. If the polysilicon plug is to be a resistive load, it may be left undoped, lightly doped with an n-type dopant ions such as phosphorus or arsenic or a very light p-type dopant which will electrically convert to an n-type at 250° K and above. If the polysilicon plug is to be a reverse biased diode load, it is doped moderately to heavily with a p-type dopant such as boron, either by an ion implant process or a boron gaseous pre-deposition process; the p-type dopant must go relatively deeply into the plug. Following the p doping of the plug, a relatively shallow n type implant, such as arsenic, may be implanted or deposited into the plug. This will form a junction diode in the plug, n type on top and p type below for positive voltage supplies and n channel FETs. If silicide is formed below the plug, it makes ohmnic contact to the n+ drain region. If the plug directly contacts the n+ drain, this will form a forward biased diode between the n+drain and the p type plug bottom. This back-to-back plug diode/drain region does form an NPN bipolar transistor; but the p base "floats" and current is limited by the reverse biased n+/p diode at the top of the plug. Any other appropriate process to dope the polysilicon plug can be used to dope the polysilicon plug.

Figure 4:
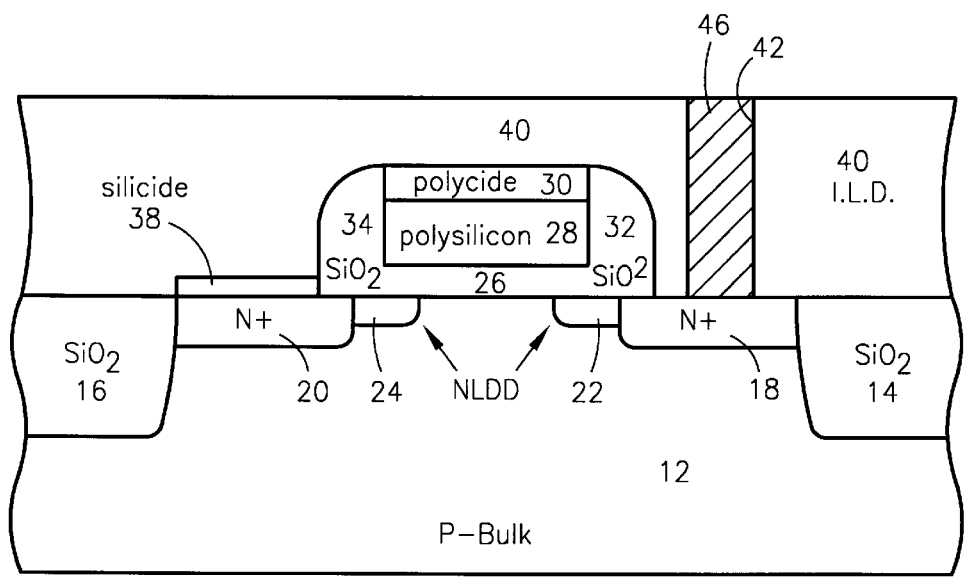
FIG. 4 shows the excess polysilicon removed from the transistor structure leaving the polysilicon plug formed in the opening in the interlayer dielectric.

Referring to FIG. 4 there is shown the partially formed transistor 10 with the polysilicon layer 44 (FIG. 3) removed leaving a polysilicon plug 46 in the opening 42. The polysilicon layer 44 is removed by one of several methods, a chemical mechanical polish, a plasma etch, or a wet etch. If a plasma etch or a wet etch is used, it is preferable to anneal first to form solid phase epitaxy in the plug 46 because polysilicon etches faster than monocrystalline silicon. If the polysilicon plug 46 has not been doped, the plug 46 may be doped at this time with an ion implant, either n-type or p-type, or by a boron gaseous predeposition. In addition, if not already annealed, the device should be annealed at this point in the manufacturing process. The annealing may be by furnace or by rapid thermal anneal, with rapid thermal anneal preferable to minimize transistor junction drive. In the case without drain silicide this anneal creates solid phase epitaxy from the bulk silicon 12 upward. In addition, part or all of the polysilicon plug 46 may be monocrystalline and the remainder, if any, at the top will be polycrystalline. The anneal also activates the implant doping and results in diffusion from the top of the polysilicon plug 46 downward. As discussed above, if the polysilicon plug 46 is doped as an electrical n-type, the polysilicon plug 46 will be a resistive load, and if the polysilicon plug 46 is doped as an electrical n-type into p-type, the polysilicon plug 46 will be a reverse biased diode load.

Figure 5:
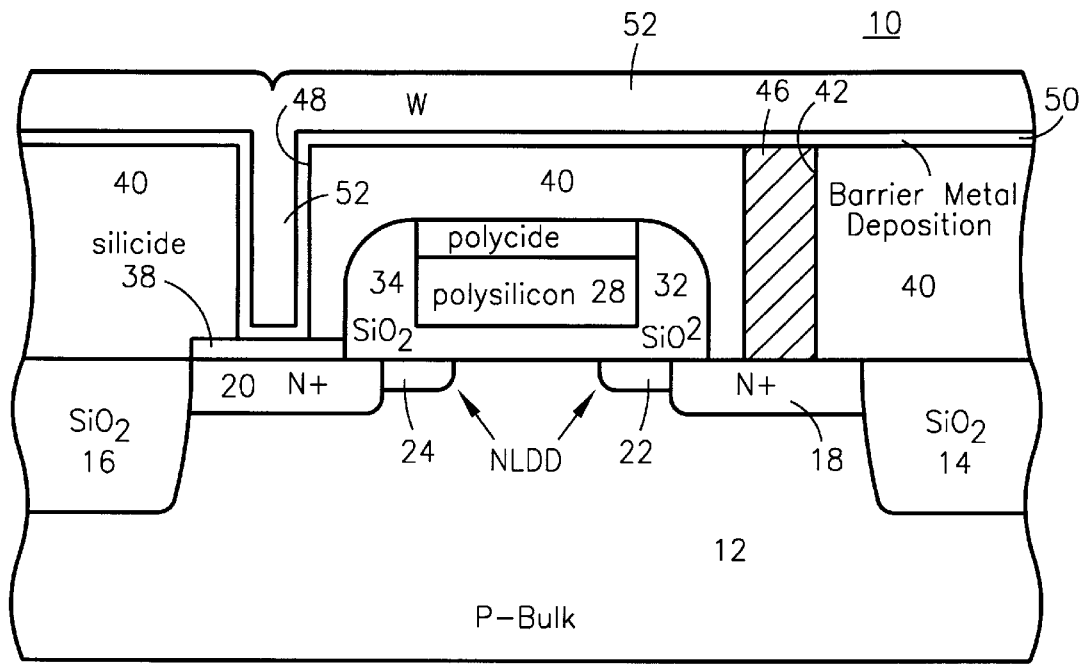
FIG. 5 shows a standard contact formed on the source of the transistor.

Referring to FIG. 5 there is shown the partially formed transistor 10 with an opening 48 formed in the interlayer dielectric 40 over the source region 20. After the opening 48 is formed a barrier metal layer 50 is deposited on the transistor 10 including the surface of opening 48. Examples of barrier metals are Ti or TiON (titanium or titanium oxynitride). After the barrier metal layer is deposited a tungsten layer (W) 52 is deposited on the surface of the transistor 10 including the opening 48.

Figure 6:
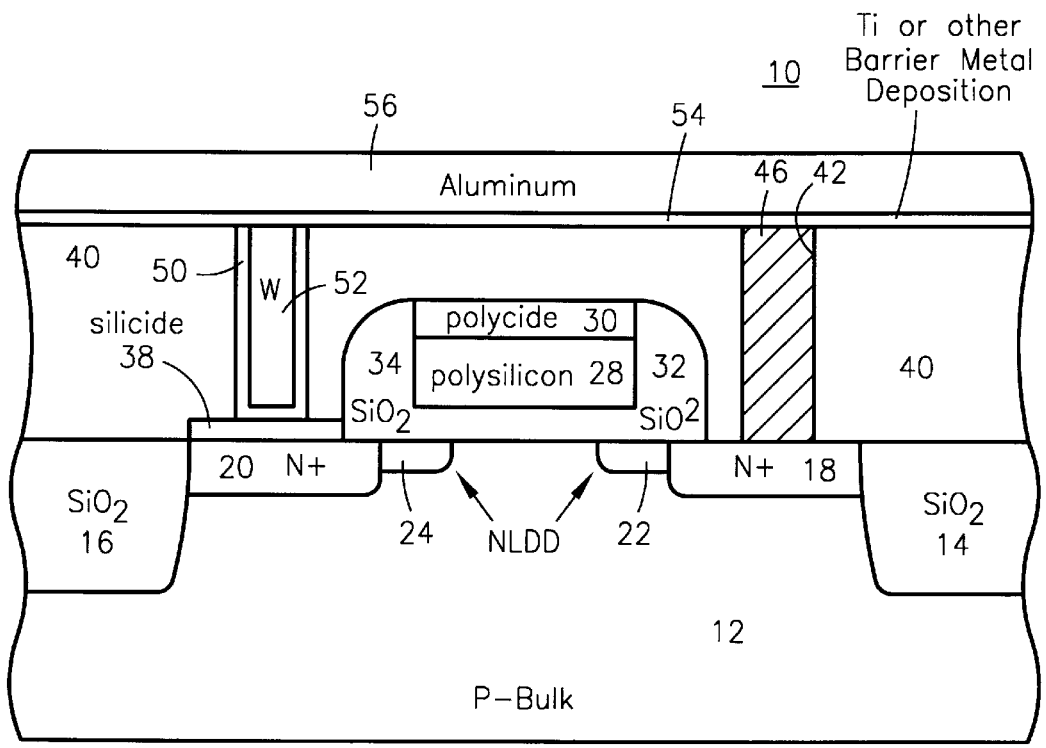
FIG. 6 shows a layer of aluminum formed on the transistor which will be selectively removed to form electrical contacts to the transistor.

Referring to FIG. 6 there is shown the partially formed transistor 10 as shown in FIG. 5 with the tungsten layer 52 and the portion of the barrier metal layer 50 formed on the top surface of transistor 10 removed leaving only the tungsten plug 52 formed over the source region 20 in the opening 48 which has a barrier metal layer 50 formed on the surface of opening 48. After the tungsten layer 52 and barrier metal layer 50 are removed, a barrier metal layer 54 is deposited on the surface of transistor 10 and an aluminum layer 56 is formed on the barrier metal layer 54. The barrier metal layer 54 can be made of titanium or a barrier metal that will prevent aluminum diffusion into the polysilicon plug. The aluminum layer 56 is the first interconnect layer and could be polysilicon (highly doped to be conductive), polycide, a refractory metal, or copper in place of the aluminum.

Figure 7A:
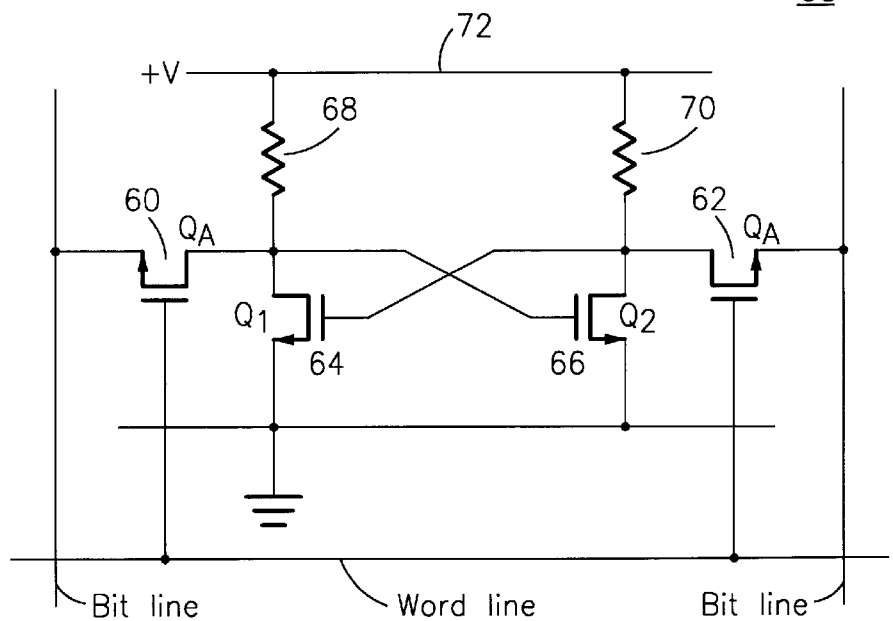
FIG. 7A shows a resistive load SRAM cell manufactured in accordance with the present invention.

Referring to FIG. 7A there is shown a schematic of an SRAM cell 58 with the polysilicon plug of the present invention doped to be a resistive load. As will be appreciated by one of ordinary skill in the integrated circuit semiconductor art, the SRAM cell 58 is constructed of four transistors rather than the more "standard" six transistor construction. The SRAM cell 58 has the standard access transistors $Q_A$, indicated at 60 and 62 which are used to access the data cell during read and write operations. The prior art SRAM cell 58 was typically either an NMOS version or a CMOS version. In either the NMOS version or the CMOS version, transistors $Q_1$ 64 and $Q_2$ 66 are n-channel MOSFETs and are typically cross-connected to each other to form an RS (Reset-Set) flip-flop. In the NMOS version the two other transistors are n-channel depletion mode transistors or thin film polysilicon load resistors and in the CMOS version the two other transistors are p-channel MOSFETs or thin film polysilicon load resistors. In the embodiment of the present invention, shown in FIG. 7A, a first polysilicon resistive load plug is shown at 68 and a second polysilicon resistive load plug is shown at 70. The polysilicon resistive loads 68 and 70 are connected between the drain regions of MOSFETs 64 and 66 and any conductive layer to distribute the positive power supply voltage, $V_{DD}$, represented by line 72. As will be appreciated by a person of ordinary skill in the art, polysilicon resistive loads 68 and 70 are shown in locations that the two other transistors would be formed in a prior art SRAM cell. The resistance of the polysilicon resistive loads is in the range of 100M ohms to 1000M ohms or even higher. The resistance of the polysilicon resistive load is determined by the ion implantation dose and by adjusting the polysilicon load anneal parameters. The practical upper limit of the polysilicon load resistance is determined by the requirement that the $I_{DOFF}$ of the transistor must be less than the V/R of the load over the operating range of the SRAM. The practical lower limit of the polysilicon load resistance is determined by the type of polysilicon in the load. For polycrystalline loads which typically have a large positive temperature coefficient, that is, leakage goes up with temperature, the lower limit would be determined from the cold temperature specification of the product. On the other hand, fully monocrystalline plug loads will not have as high an upper resistance capability but they also do not have the extreme positive temperature coefficient of the polysilicon load, therefore the lower resistance limit of the monocrystalline plug loads would be bounded by current drain and product $I_{DD(SBY)}$ requirements. For example, for a 1 micro ampere load current, one 1 MBit SRAM would draw 1 ampere in standby mode which would be considered too high. For this reason, at least 10M ohm loads would be the lower resistance limit of the monocrystalline plug load.

Figure 7B:
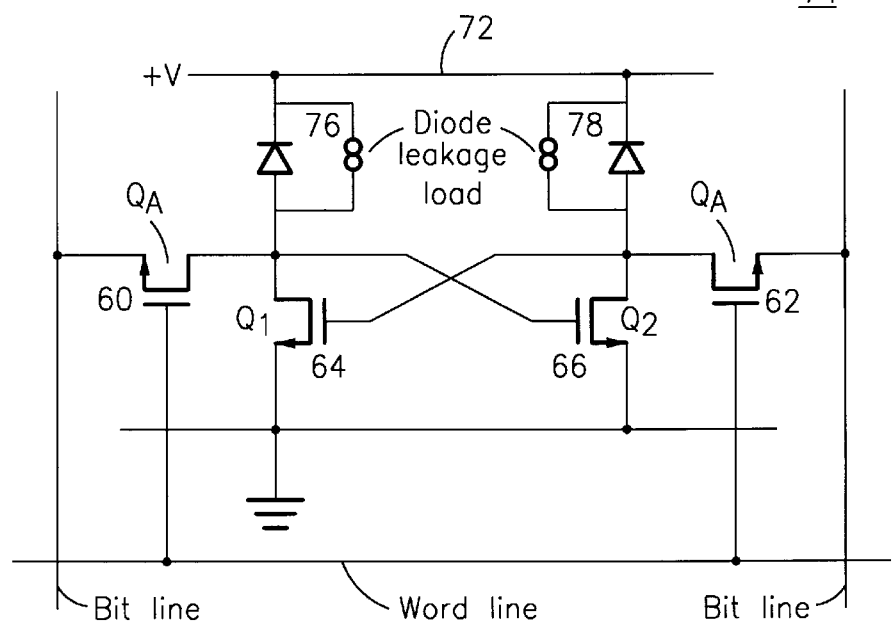
FIG. 7B shows a diode reverse leakage load SRAM cell manufactured in accordance with the present invention.

Referring to FIG. 7B there is shown a schematic of an SRAM cell 74 with the polysilicon plug of the present invention doped to be a diode load. The polysilicon diode load plug is created by an n-type and p-type dopant in the polysilicon plug. This creates a reverse biased diode at the N+ drain junction and the p-type plug. The anneal of the polysilicon plug can create a good diode junction if the solid phase epitaxial growth (SEG) is nearly perfect. However, the resulting diode leakage can be less than $I_{DOFF}$ of the transistor, so some reverse leakage is desirable. The reverse diode leakage has a large positive temperature coefficient which makes the cold temperature specification important. The leakage can be increased from the ideal in several ways:

1) very light p-type doping, such that the polysilicon plug is depleted at full power supply voltage;
2) very heavy p-type doping such that the N+/P+plug doping is at or near the zener regime, that is, less than approximately 6 volts;
3) the plug is doped with other materials such as oxygen, which will increase leakage; or
4) The plug is not fully annealed so that it is still polycrystalline which will increase reverse leakage.

In the embodiment of the present invention, shown in FIG. 7B, a first polysilicon diode load plug is shown at 76 and a second polysilicon diode load plug is shown at 78. The polysilicon diode loads 76 and 78 are connected between the drain regions of MOSFETs 64 and 66 and the first metal layer, represented by line 72. As discussed above, in regard to the embodiment of the present invention shown in FIG. 7A, the SRAM cell 74 is constructed of four transistors rather than the standard six transistor construction. The SRAM cell 74 has the standard access transistors $Q_A$, indicated at 60 and 62 which are used to access the data cell during read and write operations. As discussed above, the prior art SRAM cell was typically either an NMOS version or a CMOS version. In either version, transistors 64 and 66 are n-channel MOSFETs and are typically cross-connected to each other to form an RS flip-flop. In the NMOS version the two other transistors are n-channel depletion mode transistors or thin film polysilicon load resistors and in the CMOS version the two other transistors are p-channel MOSFETs or thin film polysilicon load resistors. The polysilicon diode loads 76 and 78 are shown in locations that the two other transistors would be formed in a prior art SRAM cell.

Figure 8:
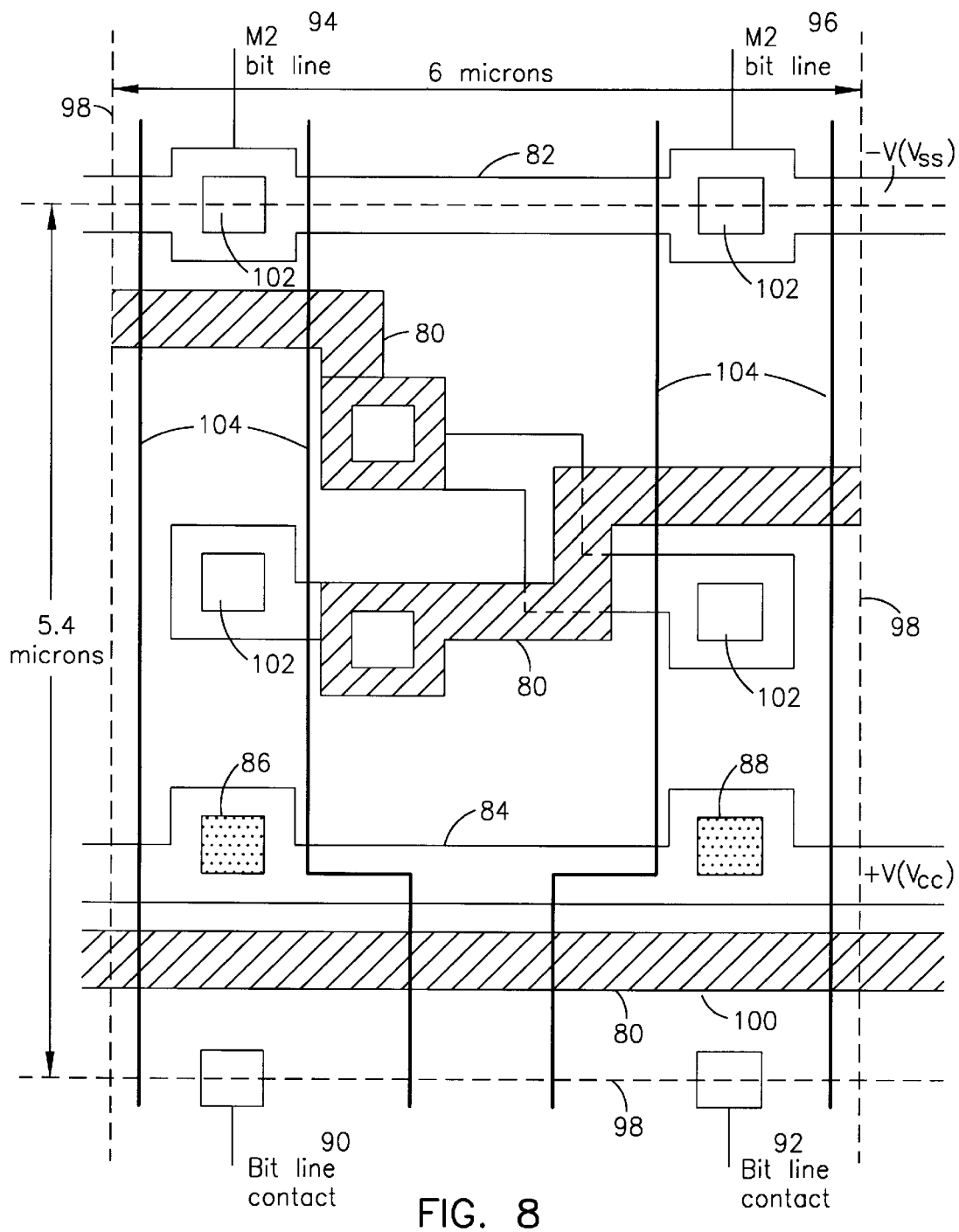
FIG. 8 shows an exemplary layout of the poly plug SRAM cell manufactured in accordance with the present invention.

Referring to FIG. 8 there is shown an exemplary layout of the polysilicon plug SRAM cell. The example uses 0.4 micron feature sizes with a conservative layout which results in a cell size of 5.4 microns by 6 microns or a cell with an area of 32.4 square microns. This would allow a 1 MBit SRAM core in 50,232 mil$^2$. As is known in the SRAM cell design art, "creative whittling" the cell design should be capable of a reduction of 10–20° in cell area. The cell interconnects, indicated at 80, are in polysilicon and metal 1 is used for the $V_{ss}$ line 82 and $V_{cc}$ line 84. The polysilicon plugs are indicated at 86 and 88. The bit lines, indicated at 90 and 92 are in metal 2 and connect one cell to the next as indicated at 90 and 92 and at 94 and 96, which indicates that shared contacts are used for $V_{ss}$ and the bit lines. As can be appreciated, other cell layouts may be used with the polysilicon plug loads. The dashed lines 98 indicate the cell boundaries, the word line is indicated at 100 and first metal with contacts are indicated at 102. The source/drain boundaries are indicated at 104.

The foregoing description of the preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications which are suited to the particular use contemplated. All such modifications and variations are within the scope of the invention as determined by the appended claims when interpreted in accordance with the breadth to which they are fairly, legally, and equitably entitled.

What I claim is:

1. A method of manufacturing a selective epitaxial growth circuit load element in an integrated semiconductor device, the method comprising:

forming a dielectric layer over the semiconductor device;

forming an opening in the dielectric layer over a region of the semiconductor device;

forming a layer of a silicon material over the dielectric layer wherein the opening in the dielectric layer is filled with the silicon material forming a plug;

annealing the semiconductor device forming solid phase epitaxial silicon in the plug;

doping the plug with a dopant of a first type; and doping the plug with a dopant of a second type, wherein a reverse biased junction diode is formed in the plug.

2. The method of claim 1 wherein the dopant of a first type is a p type dopant and the dopant of a second type is an n type dopant forming said reverse biased junction diode in the plug for a positive supply voltage and an n channel integrated circuit semiconductor device.

3. The method of claim 2 wherein the silicon material formed over the dielectric layer is polysilicon.

4. The method of claim 2 wherein the silicon material formed over the dielectric layer is amorphous silicon.

5. The method of claim 3 wherein the step of doping the plug with a dopant of a first type is at a concentration such that the plug is depleted at power supply voltage.

6. The method of claim 3 wherein the step of doping the plug with a dopant of a first type is at a concentration such that the diode junction in the plug is at a zener regime of approximately 6 volts.

7. The method of claim 3 wherein the plug is doped with a material to increase reverse leakage of the diode junction.

8. The method of claim 7 wherein the plug is doped with oxygen to increase the reverse leakage of the diode junction.

9. The method of claim 1 wherein the step of annealing the semiconductor device is such that the plug is not fully annealed leaving a portion of the plug polycrystalline wherein reverse leakage of the diode junction is increased.

* * * * *